US006958664B1

(12) United States Patent
Lyke

(10) Patent No.: US 6,958,664 B1
(45) Date of Patent: Oct. 25, 2005

(54) VARIABLE PERMITTIVITY STRUCTURE BASED ON MICRO-ELECTROMECHANICAL SYSTEMS (MEMS)

(75) Inventor: James C. Lyke, Albuquerque, NM (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 10/741,137

(22) Filed: Dec. 22, 2003

(51) Int. Cl.[7] .......... H01P 3/08; H03H 7/40
(52) U.S. Cl. .......... 333/161; 333/34
(58) Field of Search .......... 333/24 C, 33, 333/34, 105, 161, 205, 245

(56) References Cited

U.S. PATENT DOCUMENTS 5,173,666 A * 12/1992 Babbitt et al. .......... 333/33
6,075,424 A * 6/2000 Hampel et al. .......... 333/161
6,816,668 B2 * 11/2004 McDonald et al. .......... 392/375

* cited by examiner

*Primary Examiner*—Dean Takaoka
(74) *Attorney, Agent, or Firm*—William G. Auton

(57) ABSTRACT

A variable permittivity structure is proposed based on composition of two different dielectrics in a transmission line. The composition is adjusted through a thermally-actuated MEMS structure, and this compositional adjustment alters the relative permittivity at least at a macro level. Adjusting the permittivity leads to tune-able impedances in the associated transmission line. The proposed invention can also be used as a variable capacitor, and it can be used to create variable capacitor, and it can be used to create variable couplers and other structures. Since the approach does not alter any conducting surfaces in the transmission line, it is believed to lead to a superior technique for impedance matching to reduced physical discontinuity.

9 Claims, 8 Drawing Sheets

VARIABLE PERMITTIVITY STRUCTURE BASED ON MICRO-ELECTROMECHANICAL SYSTEMS (MEMS)

STATEMENT OF GOVERNMENT INTEREST

The invention described herein may be manufactured and used by or for the Government for governmental purposes with out the payment of any royalty thereon.

BACKGROUND OF THE INVENTION

The present invention relates generally to micro-electro mechanical systems and more specifically to a structure that can alter the propagation characteristics of transmission lines in micro-circuits through the modification of local permittivity.

In microelectromechanical systems (MEMS), a great variety of techniques exist to form movable structures that may be co-integrated with electrical interconnection and device structures. Thermal actuators, which can be built in a number of traditional MEMS technologies, can produce lateral motion using simple structures. Prior Act in this technology is disclosed in the following U.S. patents, the disclosures of which are incorporated herein by reference: U.S. Pat. No. 6,232,841 issued to Bartlett; U.S. Pat. No. 4,719,429 issued to Ikezi; and U.S. Pat. No. 5,032,805 issued to Elmer. While the above-cited references are instructive, a need remains to be able to adjust propagation characteristics in MEMS transmission lines. The present invention is intended to satisfy that need.

SUMMARY OF THE INVENTION

A variable permittivity structure is proposed based on composition of two different dielectrics in a transmission line. The composition is adjusted through a thermally-actuated MEMS structure, and this compositional adjustment alters the relative permittivity at least at a macro level. Adjusting the permittivity leads to tuneable impedances in the associated transmission line. The proposed invention can also be used as a variable capacitor, and it can be used to create variable couplers and other structures. Since the approach does not alter any conducting surfaces in the transmission line, it is believed to lead to a superior technique for impedance matching to reduced physical discontinuity.

It is an object of the present invention to provide a revolutionary new approach to adjusting propagation characteristics in MEMS transmission lines.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention includes a variable permittivity structure based on micro-electromechanical systems. The purpose of the proposed invention is to provide a structure that can alter the propagation characteristics of transmission lines in micro-circuits through the modification of local permittivity. The proposed invention operates by introducing in a controlled method a material with a high permittivity is inserted into a dielectric medium of a primary transmission line structure having a lower permittivity. When implemented as a repeatable unit, the invention can be used singly or in a distributed manner throughout transmission line structures in a microwave integrated circuit, to form tuneable impedance sections in microwave integrated circuits. The invention can also be used as a tune-able reactance, i.e. a programmable capacitance.

Figure 1:
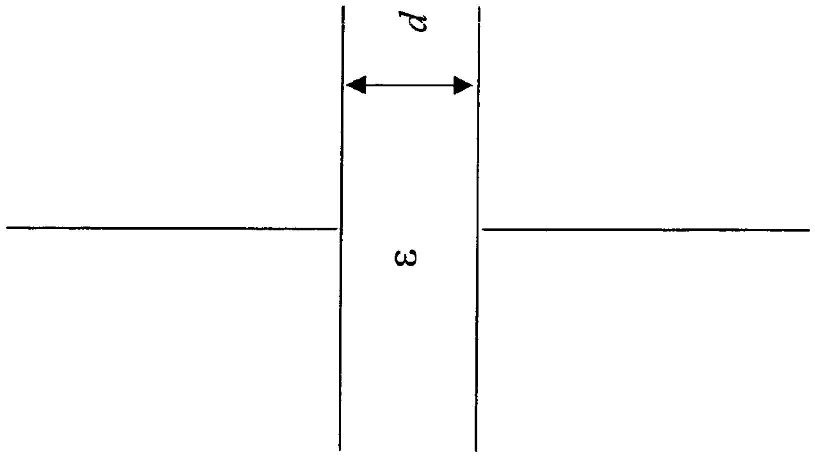
FIG. 1 is an illustration of a complete parallel plate structure with capacitance.
Figure 2:
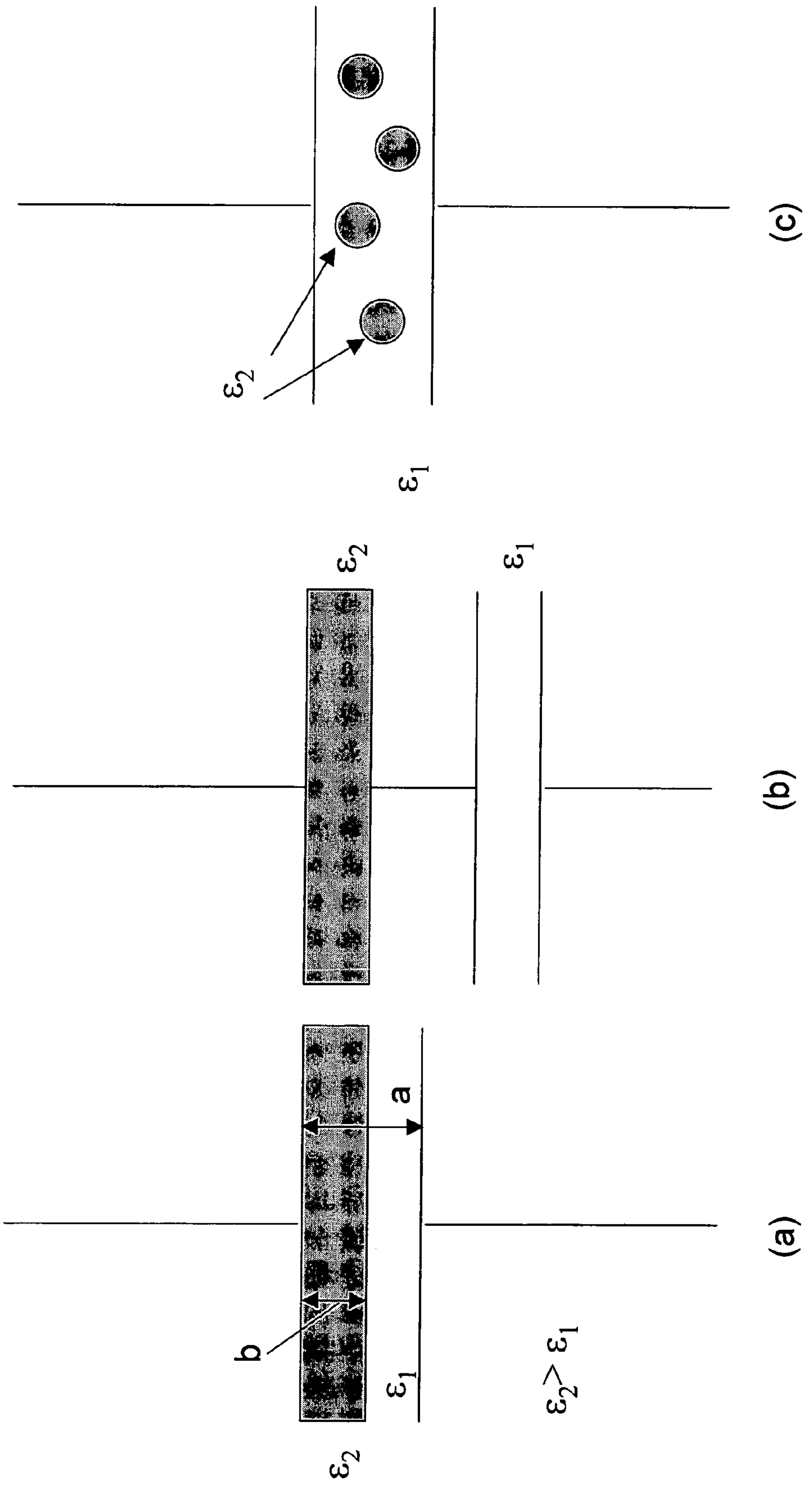
FIGS. 2*a*–2*c* show adjustments in capacitance between 2 plates.

The capacitance of a parallel plate structure (FIG. 1) is approximated as $C=\epsilon A/d$, where $\epsilon$ is permittivity, A is the area of the plates, and d is the distance between the plates. The formula is inexact for non-infinite plates, due to fringing effects. The permittivity in homogeneous material is also written as $(\epsilon r \epsilon_0)$, where $\epsilon_0$ is the free-space permittivity (that of a vacuum) and $\epsilon r \geqq 1$ is the relative permittivity, sometimes referred to as the dielectric constant. Introducing other materials in the gap affects capacitance. For example, when a slab of a second material with a higher permittivity is introduced into the gap between the plates (FIG. 2*a*), the capacitance is correspondingly increased. The effect is identical to two capacitors in series (FIG. 2*b*), with each capacitor and their series combination having a higher value than the original one (FIG. 1). Through the FIG. 2*a* case is intuitively simple and readily analyzed, it is also clear that these statements apply to more complex situations, such as that shown in FIG. 2*c* where a number of shapes are embedded in the "primary" dielectric. These, too, have the effect of increasing capacitance. It is also possible to interpret these situations as changing the dielectric constant or the permittivity of the material to a different value, i.e. an effective relative permittivity. In other words, the situations illustrated in FIG. 3 could be incorporated in the expression $C=\epsilon_0 \epsilon r_{,eff} A/d$, where $\epsilon_1 < \epsilon r,_{eff} < \epsilon 2$ is the effective relative permittivity.

Figure 3:
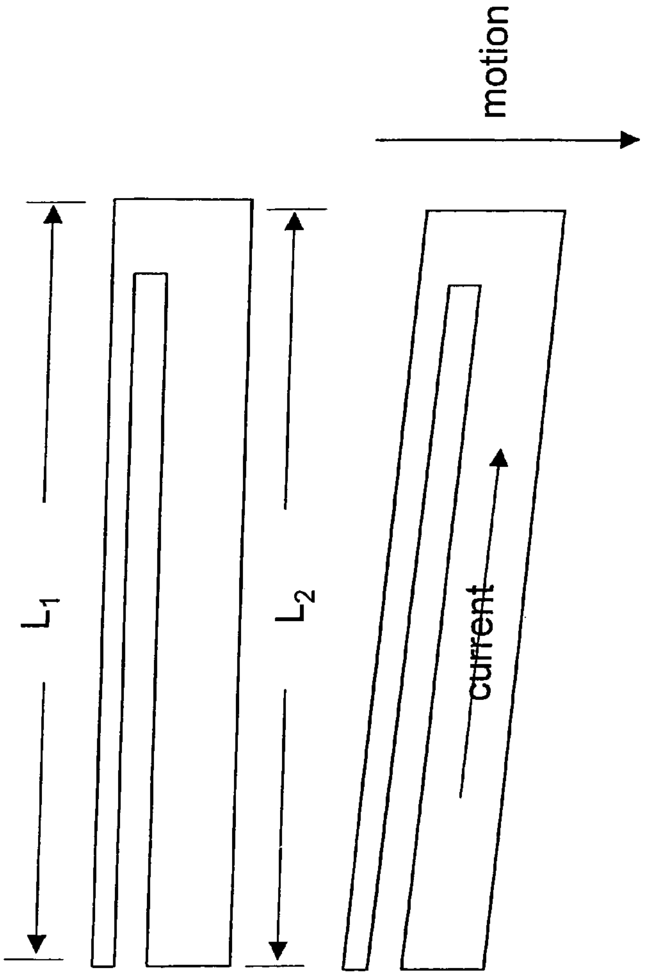
PRIOR ART Figure 3
FIG. 3 is a block diagram of prior art MEMS technologies.

In microelectromechanical systems (MEMS), a great variety of techniques exist to form movable structures that may be co-integrated with electrical interconnection and device structures. Thermal actuators, which can be built in a number of traditional MEMS technologies can produce lateral motion using simple structures such as shown in FIG. 3. In this structure, a single conductor is fashioned into two sections have equal lengths L1 and L2, but with different cross-sectional area in each piece. Since resistance is inversely proportional to cross-sectional area, the resistive heating under current flow affects the higher resistance structure more than the (larger) lower resistance structure. Since these materials expand with increased temperature, an elongation is experienced in both sections, however, the amount of change in L1 is greater than that in L2, since L1 (with its higher resistance) heats up more than L2. The result is a lateral movement of the entire structure. Such structures have been built for switches and other MEMS-based applications.

Figure 4:
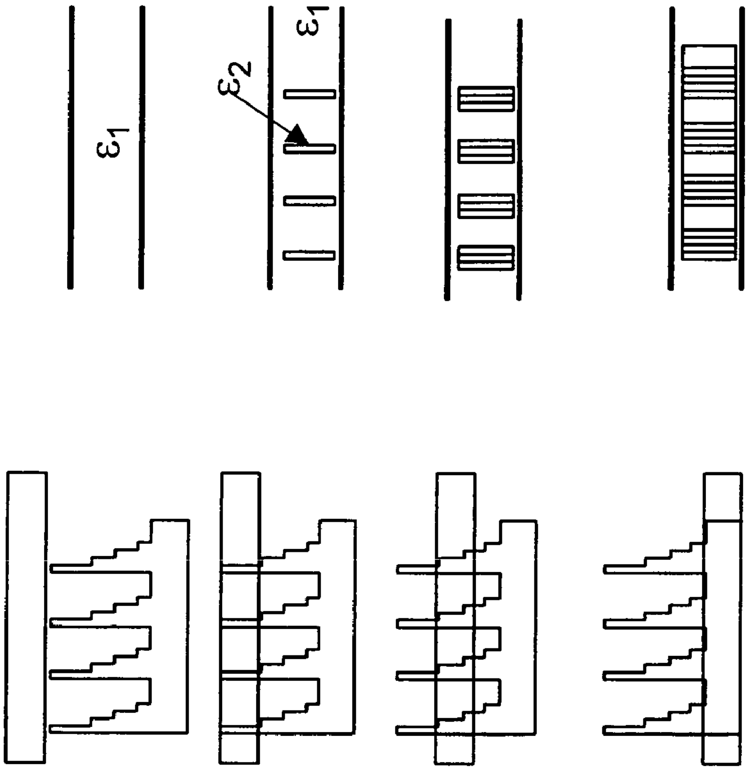
FIG. 4 is a diagram of the principle of the present invention.

The proposed invention establishes a tune-able permittivity structure by exploiting MEMS structures and simple electromagnetic principles the concept for doing this is based on the existence of a planar transmission structure such as a microstrip built in an integrated circuit with an ambient vacuum or gas dielectric. The dielectric in this case forms a gap in the transmission between conductors. The principle of the proposed invention relies on the alteration of effective relative permittivity by laterally inserting a second material in the gap in a controlled manner. The principle of the proposed invention is illustrated in FIG. 4. The range of motion admits an amount of the second material into the gap as an increased function of lateral position. The approximated plan view and transverse cross-sectional view is shown. As the lateral position of the second material is advanced, the cross section of the metal-dielectric system is altered, specifically to include more material between the "plates", thereby increasing the permittivity locally. As more material appears in this sectional view, the permittivity is increased until some maximum value is reached.

Figure 5:
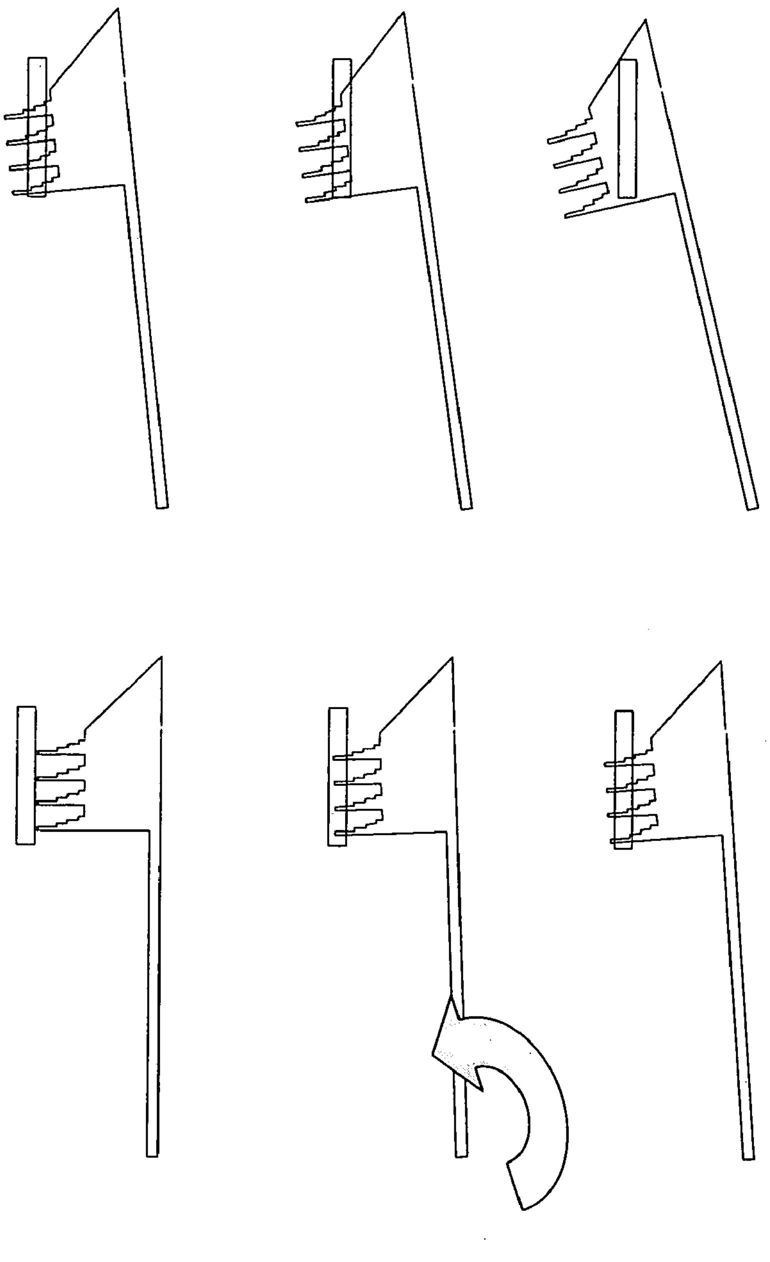
FIG. 5 is another embodiment of the present invention.
Figure 6:
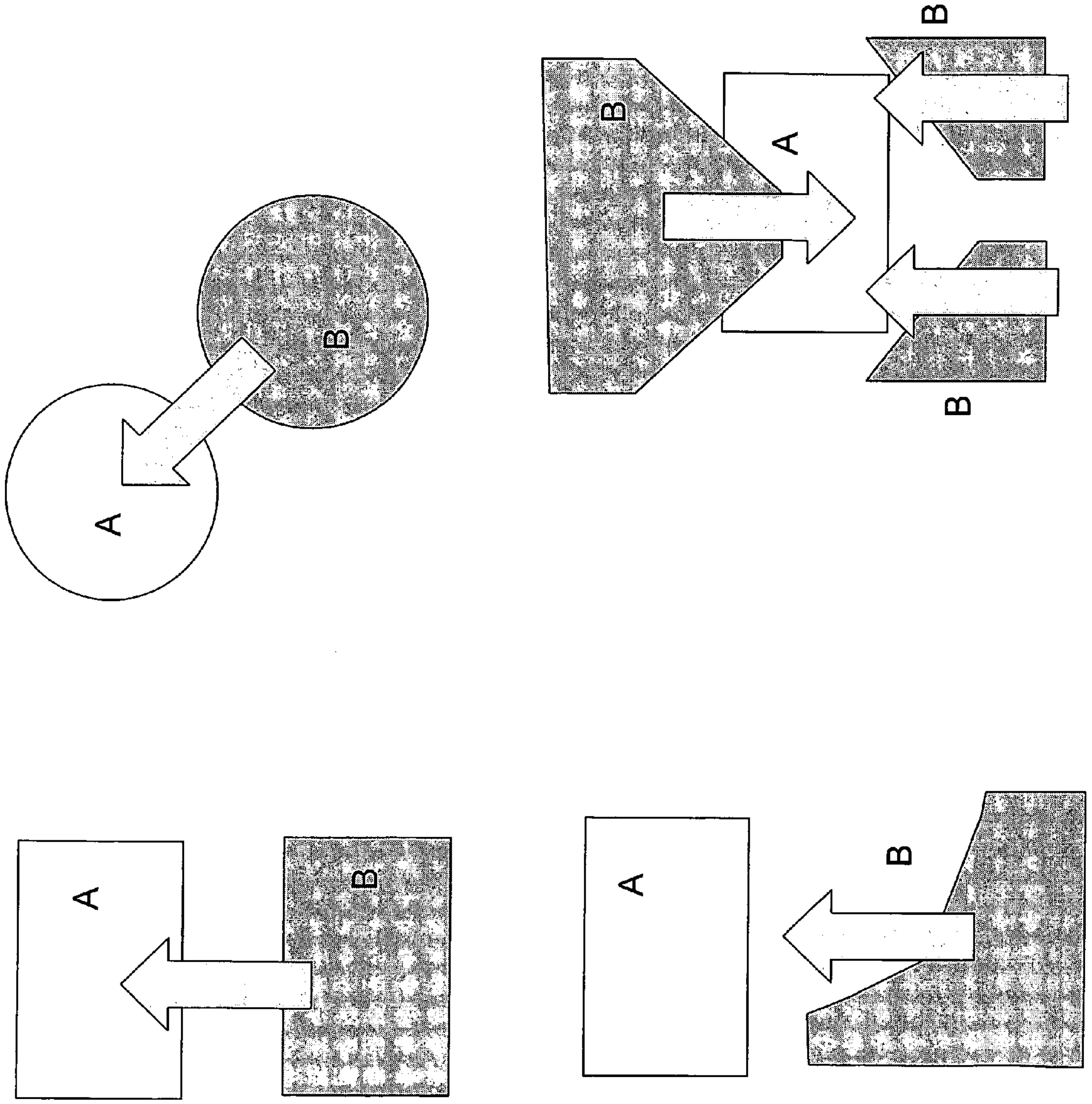
FIG. 6 is a diagram of a variety of engagement geometries of the present invention.
Figure 7:
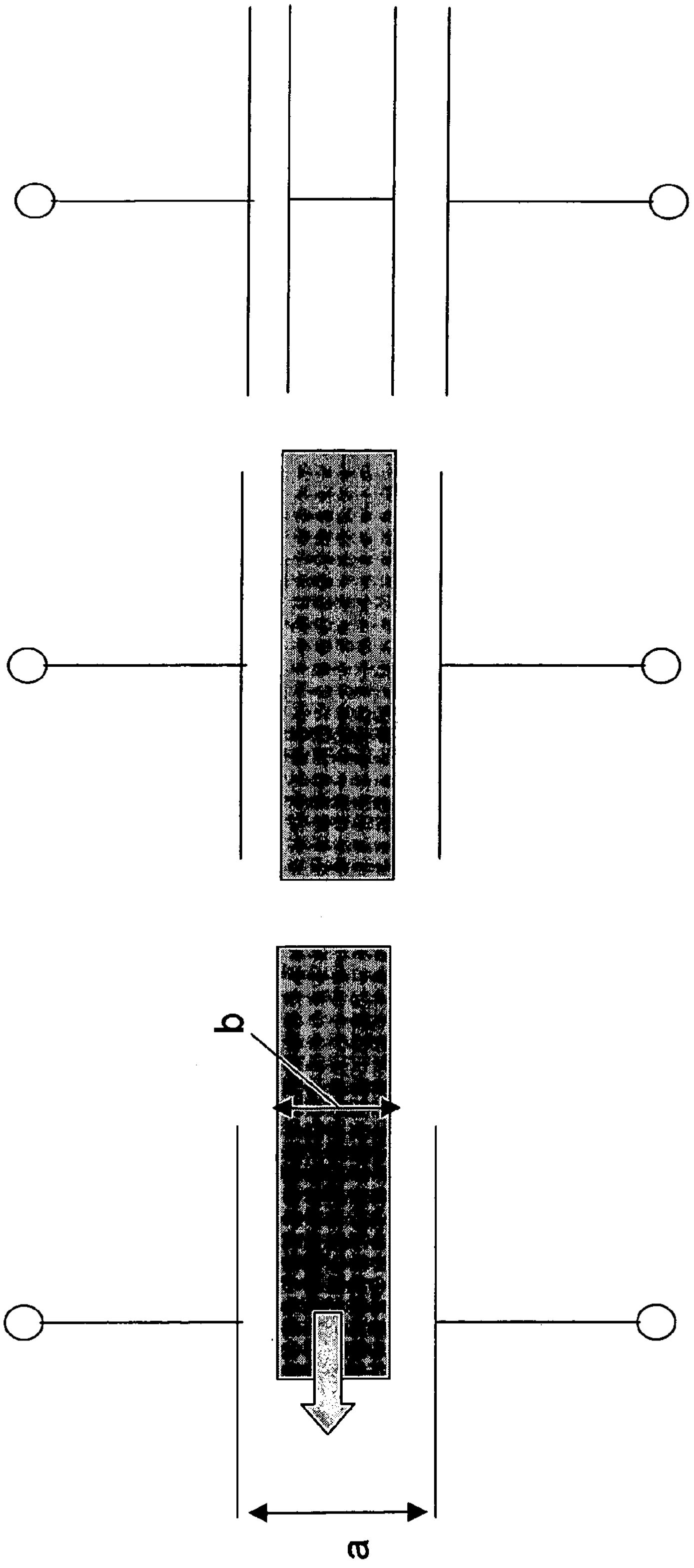
FIG. 7 is a diagram of the capacitance alteration technique of the present invention.
Figure 8:
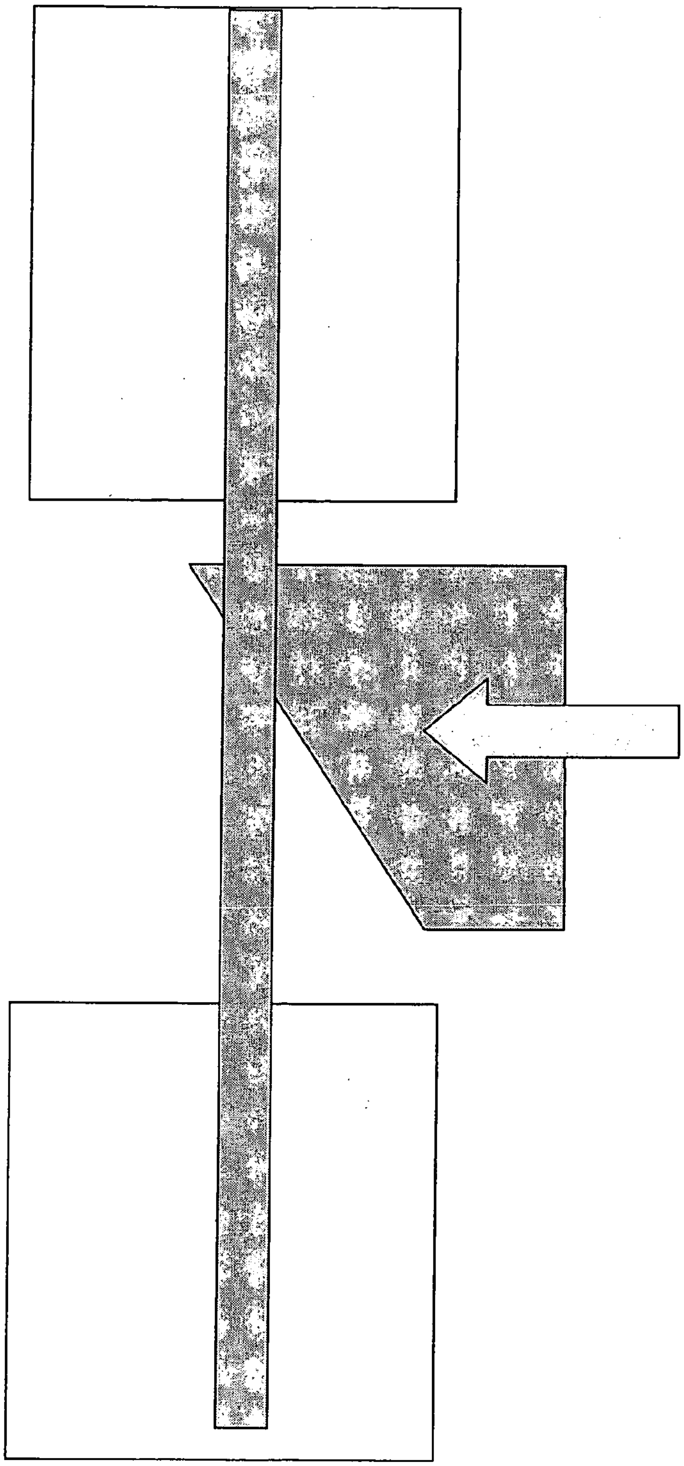
FIG. 8 is a diagram of the transmission line impedance of the present invention.

FIG. 4 assumes perfect rectilinear translational motion and a particular shape. Of course, most MEMS structures including the one illustrated in FIG. 3 do not provide perfect translation, and the only requirement regarding the shape and composition of the second material is that: (1) it must have a higher permittivity and (2) it must introduce a volume fraction relative to the volume of a gap that increases with progressive motion. FIG. 5 illustrates an alternative embodiment, based on a cantilever. Each step in the sequence represents a 2 degree tilt in the cantilever, except for the last Figure, which introduces a 5 degree tilt. FIG. 6 illustrates a variety of engagement geometries that should reinforce the previous statements. In each example, the "A" material represents the plates and the "B" material represents the mobile element that tunes permittivity. This Figure only hints at the great number of approaches that could be used to alter the volumetric ratio of two materials in the transmission line structure.

It is not strictly necessary that the material be a dielectric in the proposed invention. Conductor materials will also provide a similar alternation in capacity or impedance, even within the environment of a primary material with a homogeneous dielectric. Even though the dielectric is homogeneous, it is possible to interpret the situation as an effective relative permittivity, where $\epsilon r,_{eff}=\epsilon\alpha/(\alpha)$.

The proposed invention is primary intended to be used in situations where a transmission line impedance adjustment is desired. The proposed invention would be used judiciously within a manifold of planar single and multiconductor transmission line structures to provide the capability of impedance adjustment. If the design default position has the gap completely empty, then the adjustment is one-sided as it is only possible to increase permittivity in that case. However, if the default position involves a mid-range adjustment between the extremes of empty and fully occluded, then a two-sided adjustment is possible, where the effective permittivity is adjustable both downward and upward.

It is possible to also create variable coupling by applying the basic principle of the invention to multiple, neighboring conductors in a common dielectric medium. In this case, the coupling energy between conductors is approximately proportional to permittivity. The role of the proposed invention in this case is to provide an increased coupling between those conductors by adjusting the effective permittivity. Of course, in addition to improving coupling, the non-coupled impedance of each conductor is also affected, and that effect must be compensated for in design.

The proposed invention provides a technique for electronic reconfiguration of a material parameter at a local scale. In particular, the invention provides the ability to adjust relative permittivity. Since the adjustment can be performed in situ, it is greatly advantageous for incorporation in systems in the field, in which programmability can extend functionality or mission life in ways not possible in designs where permittivity is fixed. It provides a basic contribution to microwave integrated circuits, antenna structures, high-speed electronics, instrumentation, and programmable systems in general.

Alternative approaches to this problem have been proposed in the form of an adjustable capacitor. Such designs typically involve an electrostatically-actuated MEMS structure, and focus on the notion of a capacitor as an lumped element. These concepts work off of vertical plate adjustment rather than altering the dielectric composition. They do not provide the flexibility of the proposed invention for permittivity adjustments for the coupled arrangements. Furthermore, though the interpretation of locally adjusted permittivity vice lumped capacitance is often subtle, the differences become more important at higher frequencies. Impedance matching, viewed from the latter perspective, is a necessary but insufficient condition to prevent wave reflections, and physical discontinuities can lead to reflects, even in impedance matched structures. The proposed invention is believed to provide a lower discontinuity profile than many of the previously conceived structures for variable capacitance and may provide superior performance, particularly in higher bands of the electromagnetic spectrum.

In a broad sense, the present invention can be defined as a planar transmission microstrip adjustment process for adjusting electrical characteristics of a planar microstrip transmission line that has a first and second conductor with a gap therebetween, said process comprising: a step of adjustably inserting a dielectrics into the gap between the first and second conductor to adjustably alter permittivity of the planar transmission microstrip; monitoring the permittivity of the planar transmission microstrip; and rerunning the inserting and monitoring steps until an optimum performance is achieved.

In the process as defined above, the rerunning step includes: correlating the permittivity measured in the monitoring step with a transmission line impedance; and comparing the transmission line impedance with a predetermined ideal value to determine thereby if further adjustments are necessary. The inserting step is accomplished wing any dielectric material that is readily deposited at temperatures less than 50 deg C (for example) (2) the means of actuation can be any of the standard means of actuating MEMS devices, such as thermal, electrostatic, or electromagnetic a LIGA MEMS to produce lateral motion using thermal actuation.

Example dielectrics:

polymides–dielectric constant=3–4 benzocyclobutene–dielectric constant=2.7

$SiO2$–dielectric constant=3.9

Porous organosilicates=2.6–3.1

This is not an all-inclusive list. The desirable properties are that the dielectric constant be reasonably high (as this leads to the biggest dynamic range of permittivity variation), preferably higher even than these materials. There are a great many materials that gave this property, but most are not easily integrable with MEMS structures.

While the invention has been described in its presently preferred embodiment it is understood that the words which have been used are words of description rather than words of limitation and that changes within the purview of the appended claims may be made without departing from the scope and spirit of the invention in its broader aspects.

What is a claimed is:

1. A planar transmission microstrip adjustment process for adjusting electrical characteristics of a planar microstrip transmission line that has a first and second conductor with a gap therebetween, said process comprising: a step of adjustably inserting a dielectric into the gap between the first and second conductor to adjustably alter permittivity of the planar transmission microstrip; monitoring the permittivity of the planar transmission microstrip; and rerunning the inserting and monitoring steps until an optimum performance is achieved.

2. A process, as defined in claim 1, wherein said rerunning step includes: correlating the permittivity measured in the monitoring step with a transmission line impedance; and company the transmission line impedance with a predetermined ideal value to determine thereby if further adjustments are necessary.

3. A process, as defined in claim 1, wherein the inserting step is accomplished using a dielectric material that is readily deposited at temperatures less than 50 degrees C.

4. A process, as defined in claim 3 wherein said dielectric material is selected from a group consisting of polymides–dielectric constant=3–4 benzocyclobutene–dielectric constant=2.7

SiO2–dielectric constant=3.9

Porous organosilicates=2.6–3.1.

5. A process, as defined in claim 1, wherein the insertion step comprises using a microelectromechanical system to insert a wedge of dielectric material between the first and second conductors.

6. A process, as defined in claim 2, wherein the insertion step comprises using a microelectromechanical system to insert a wedge of dielectric material between the first and second conductor.

7. A process, as defined in claim 3, wherein the insertion step comprises using a microelectromechanical system to insert a wedge of dielectric material between the first and second conductors.

8. A process, as defined in claim 4, wherein the insertion step comprises using a microelectromechanical system to insert a wedge of dielectric material between the first and second conductors.

9. A process, as defined in claim 1, wherein the insertion step comprises using a microelectromechanical system to insert a wedge of dielectric material between the first are second conductors.

* * * * *